(12) United States Patent
Lorimer et al.

(10) Patent No.: US 11,133,757 B2
(45) Date of Patent: Sep. 28, 2021

(54) SYSTEM AND METHOD FOR COMBINED HEAT AND ELECTRIC POWER GENERATION

(71) Applicant: Spark Thermionics, Inc., Emeryville, CA (US)

(72) Inventors: Adam Lorimer, Emeryville, CA (US); Jared William Schwede, Emeryville, CA (US)

(73) Assignee: Spark Thermionics, Inc., Emeryville, CA (US)

( * ) Notice: Subject to any disclaimer, the term of this patent is extended or adjusted under 35 U.S.C. 154(b) by 0 days.

(21) Appl. No.: 17/170,748

(22) Filed: Feb. 8, 2021

(65) Prior Publication Data

US 2021/0249974 A1 Aug. 12, 2021

Related U.S. Application Data

(60) Provisional application No. 62/971,796, filed on Feb. 7, 2020, provisional application No. 63/133,953, filed on Jan. 5, 2021.

(51) Int. Cl.
*H02N 10/00* (2006.01)
(52) U.S. Cl.
CPC ................... *H02N 10/00* (2013.01)
(58) Field of Classification Search
CPC ........... H01J 45/00; H02N 10/00; H02N 3/00; G21H 1/10; G21H 1/103; G21H 1/106

USPC ....................................................... 310/306
See application file for complete search history.

(56) References Cited

U.S. PATENT DOCUMENTS

| | | | |
|---|---|---|---|
| 3,482,120 | A | 12/1969 | Wilson |
| 3,740,592 | A | 6/1973 | Engdahl et al. |
| 5,495,829 | A | 3/1996 | Jayaraman et al. |
| 10,546,990 | B2 | 1/2020 | Schwede et al. |
| 2008/0061158 | A1 | 3/2008 | Nakagawa et al. |
| 2010/0019619 | A1 | 1/2010 | Hagg |
| 2012/0299438 | A1 | 11/2012 | Kimura et al. |
| 2017/0016631 | A1 | 1/2017 | Shaffer |
| 2020/0321203 | A1 | 10/2020 | Schmitt et al. |

FOREIGN PATENT DOCUMENTS

CN 204285609 U 4/2015

OTHER PUBLICATIONS

Martini, W. R. "Internal flame-heated thermionic converters." In Thermionic specialist conference, p. 356. 1963.

*Primary Examiner* — Terrance L Kenerly
(74) *Attorney, Agent, or Firm* — Jeffrey Schox; Samuel Rosenthal

(57) ABSTRACT

A system for combined heat and electric power generation, preferably including a heat reservoir and one or more electric generators, each preferably including a heat source and an energy converter. A method for combined heat and electric power generation, preferably including activating an electric generator, deactivating the electric generator, and/or providing heat from a heat reservoir.

20 Claims, 4 Drawing Sheets

SYSTEM AND METHOD FOR COMBINED HEAT AND ELECTRIC POWER GENERATION

CROSS-REFERENCE TO RELATED APPLICATIONS

This application claims the benefit of U.S. Provisional Application Ser. No. 62/971,796, filed on 7 Feb. 2020, and of U.S. Provisional Application Ser. No. 63/133,953, filed on 5 Jan. 2021, each of which is incorporated in its entirety by this reference.

STATEMENT OF GOVERNMENT SUPPORT

This invention was made with government support under Grant Number DE-SC0019568 awarded by the Department of Energy. The government has certain rights in the invention.

TECHNICAL FIELD

This invention relates generally to the energy conversion field, and more specifically to a new and useful system and method for combined heat and electric power generation in the energy conversion field.

BACKGROUND

Many typical heating systems convert high-temperature heat sources, such as combustion-based heat sources, into lower-temperature heat outputs, thereby introducing thermodynamic inefficiencies. Many typical electric power generators produce waste heat that goes unused, also introducing thermodynamic inefficiencies. Thus, there is a need in the energy conversion field to create a new and useful system and method for combined heat and electric power generation.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1A:
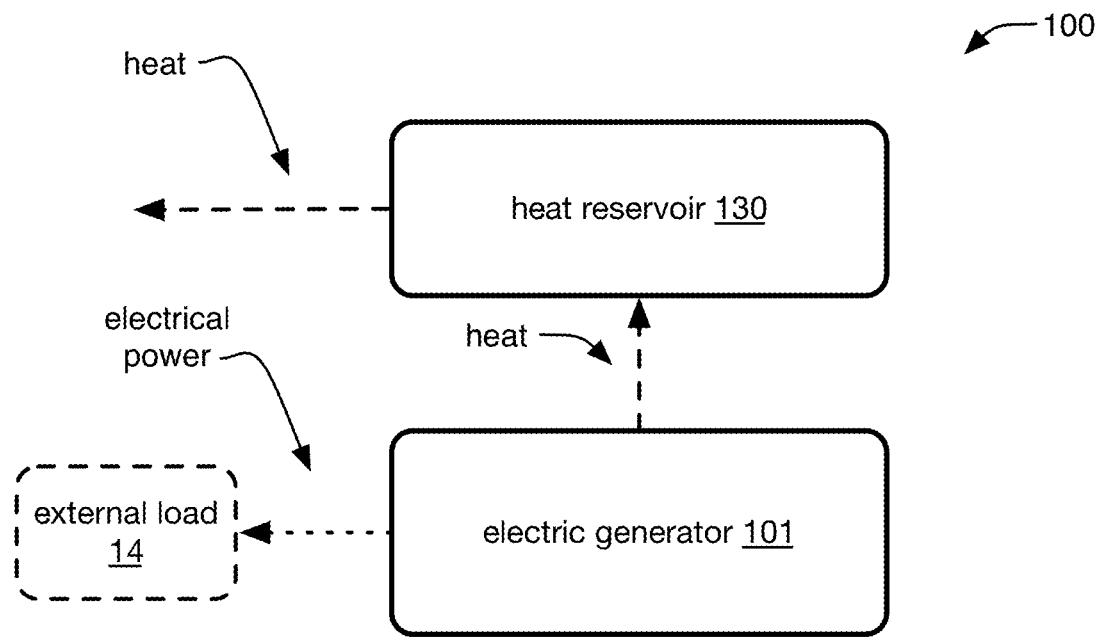
FIG. 1A is a schematic representation of an embodiment of a system for combined heat and electric power generation.
Figure 1B:
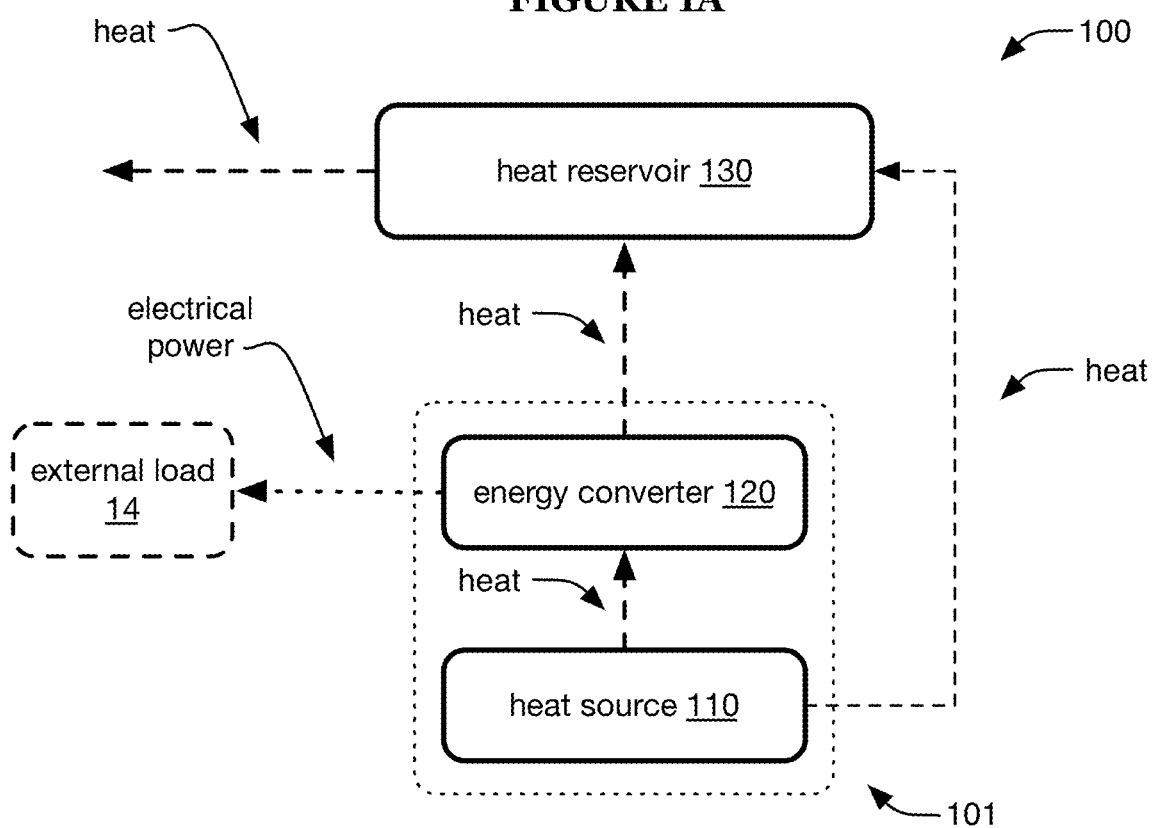
FIG. 1B is a schematic representation of an example of the embodiment depicted in FIG. 1A.

A system 100 for combined heat and electric power generation preferably includes one or more electric generators 101 and a heat reservoir 130 (e.g., as shown in FIGS. 1A-1B). The electric generator 101 preferably includes a heat source 110 and an energy converter 120. The system 100 can optionally include an electrical storage module 140 and/or any other suitable elements. However, the system 100 can additionally or alternatively include any other suitable elements in any suitable configuration.

A method 200 for combined heat and electric power generation is preferably performed using the system 100, but can additionally or alternatively be performed using any other suitable systems. The method 200 preferably includes generating both heat and electric power (e.g., concurrently generating both heat and electric power), such as described below in more detail (e.g., regarding functionality of the system 100). However, the method 200 can additionally or alternatively include any other suitable elements performed in any suitable manner.

Embodiments of the system and/or method may confer one or more benefits. First, some embodiments may enable efficient implementations of combined heat and electric power generation at small power scales. Mechanical generators are typically far less efficient at smaller power scales, such as 200-1000 W or less, than they can be at larger power scales (e.g., many kW or more), but non-mechanical (or substantially non-mechanical) electric power generators, such as those described herein, can exhibit significantly higher efficiencies. Second, in some embodiments, the use of a heat reservoir can offer one or more synergies with elements of the electric power generator. For example, the heat reservoir can optionally function as a temperature control element for one or more elements of the electric power generator, such as a cesium reservoir of a thermionic energy converter. Third, in some embodiments, the heat rejection portion (e.g., the cold side) of the electric power generator described herein may be able to tolerate a wide range of temperatures without significant reduction in electric power generator efficiency. Accordingly, such an electric power generator may be especially well suited for thermal coupling to a variable-temperature heat reservoir such as described herein. However, the system and/or method can additionally or alternatively confer any other suitable benefits.

2. System.

2.1 Heat Reservoir.

The heat reservoir 130 preferably functions to store heat rejected by the electric generator 101, and/or to provide heat (e.g., as hot water, space heating, and/or for other residential, commercial, and/or industrial uses, etc.) when desired (e.g., desired by a user of the system). The heat reservoir 130 can include any suitable elements for accepting, retaining, and/or dispensing heat, preferably at slightly elevated temperatures compared to room temperature, such as 25-200° C. (e.g., 35-120° C., 20-60° C., 50-100° C., 45-80° C., 90-150° C., etc.), but additionally or alternatively at any other suitable temperature(s).

In one embodiment, the heat reservoir includes a hot water reservoir (e.g., as shown in FIG. 1). In this embodiment, the heat reservoir can be substantially analogous to a typical water heater (e.g., residential or commercial water heater), except that heating of the water is preferably achieved using heat received from the electric generator 101 (e.g., rather than using heat generated directly by a heating module of a typical water heater, such as one or more burners, electrical resistive elements, heat pumps, etc.). The reservoir preferably includes an inlet, which can accept unheated water (and/or water of any other suitable temperature) to refill the reservoir, and an outlet, which preferably provides heated water from the reservoir. The reservoir preferably defines a cavity (e.g., which receives water at the inlet and/or provides water at the outlet) configured to store water (e.g., heated water), more preferably wherein the reservoir includes thermal insulation configured to reduce heat loss from the stored water to the surrounding environment. The inlet and/or outlet can be connected to a building water system (e.g., inlet connected to a pressurized cold water source, and outlet acting as a pressurized hot water source, wherein the hot water pressure is preferably maintained by the pressurization of the cold water source), but can additionally or alternatively be configured in any other suitable manner.

The hot water reservoir temperature can be allowed to vary over a wide range. For example, the temperature can vary between a minimum temperature (e.g., a desired water delivery temperature or minimum acceptable water delivery temperature) and a maximum temperature (e.g., temperature limit set by practical considerations, such as to prevent localized boiling of water in the reservoir). In one example, the minimum temperature can be 30-60° C. (e.g., 45-55° C., such as 50° C., etc.) and the maximum temperature can be 80-100° C. (e.g., 90-95 or 95-100° C., etc.).

The reservoir temperature can vary and/or be controlled based on system operation criteria, such as demand for heat (e.g., hot water) delivery from the reservoir. To maximize system efficiency, the electric generator 101 is preferably substantially always active, if the heat demand allows. However, if the reservoir is at or near the maximum temperature, it may be inefficient and/or unsafe to allow the generator to reject heat to the reservoir. In such circumstances, the generator is preferably deactivated to avoid such inefficient/and or unsafe conditions. The electric generator 101 can have a duty cycle greater than a threshold amount (e.g., 40%, 50%, 60%, 70%, 80%, 90%, 95%, 98%, 40-50%, 50-60%, 60-75%, 75-85%, 85-95%, and/or 95-100%, etc.), preferably greater than 50%, but alternatively any other suitable duty cycle. The reservoir and/or electric generator are preferably configured (e.g., sized) appropriately to enable such a duty cycle (e.g., to maximize the duty cycle while avoiding or minimizing times at which the reservoir temperature is less than the minimum temperature). For example, based on typical demand (e.g., residential demand) for hot water and electric power, the electric generator may be sized such that it can provide 10-75% (e.g., 20-40%) of the total electric power demand (e.g., for a residence), but can alternatively have any other suitable size.

In one example, the system is controlled such that while the reservoir temperature is below a first threshold temperature, the electric generator 101 is activated (e.g., wherein fuel is burned at the heat source 110 and electricity is generated at the energy converter 120). Under such operation, the electric generator can gradually heat the reservoir using its rejected heat, thereby enabling efficient system operation. The first threshold temperature is preferably a temperature less than the maximum temperature, but can alternatively be equal to the maximum temperature, greater than the maximum temperature, or any other suitable temperature. The first threshold temperature can be defined based on the maximum (and/or minimum) temperature, such as less than the maximum temperature by an absolute amount (e.g., 1, 2, 3, 5, 10, 15, 20, 25, 30, 0-1, 1-2, 2-5, 5-10, 10-20, and/or 20-50° C., etc.), by a relative amount (e.g., 0.1, 0.2, 0.5, 1, 2, 3, 5, 10, 15, 20, 25, 30, 0-0.3, 0.3-1, 1-2, 2-5, 5-10, 10-20, and/or 20-30% of the maximum temperature; 1, 2, 3, 5, 10, 15, 20, 25, 30, 0-1, 1-2, 2-5, 5-10, 10-20, and/or 20-50% of the difference between the minimum and maximum temperatures; etc.), and/or by any other suitable amount.

In this example, if the reservoir temperature reaches a second threshold temperature, the electric generator is preferably deactivated, thereby preventing overheating of the reservoir. The second threshold temperature is preferably a temperature greater than the first temperature, such as substantially equal to the maximum temperature or less than the maximum temperature by a smaller threshold amount (e.g., to allow for additional heat transfer after the generator is deactivated), but can alternatively be greater than the maximum temperature, less than the first threshold temperature, or any other suitable temperature. The second threshold temperature can be defined based on the maximum temperature and/or the first threshold temperature, such as less than the maximum temperature by an absolute amount (e.g., 0.2, 0.5, 1, 2, 3, 5, 10, 15, 20, 25, 30, 0-1, 1-2, 2-5, 5-10, 10-20, and/or 20-50° C., etc.) or by a relative amount (e.g., 0.1, 0.2, 0.5, 1, 2, 3, 5, 10, 15, 20, 25, 30, 0-0.3, 0.3-1, 1-2, 2-5, 5-10, 10-20, and/or 20-30% of the maximum temperature; 1, 2, 3, 5, 10, 15, 20, 25, 30, 0-1, 1-2, 2-5, 5-10, 10-20, and/or 20-50% of the difference between the minimum and maximum temperatures; etc.), greater than the first threshold temperature by an absolute amount (e.g., 0.2, 0.5, 1, 2, 3, 5, 10, 15, 20, 25, 30, 0-1, 1-2, 2-5, 5-10, 10-20, and/or 20-50° C., etc.) or by a relative amount (e.g., 0.1, 0.2, 0.5, 1, 2, 3, 5, 10, 15, 20, 25, 30, 0-0.3, 0.3-1, 1-2, 2-5, 5-10, 10-20, and/or 20-30% of the first threshold temperature; 5, 10, 15, 20, 25, 30, 40, 50, 65, 75, 85, 90, 95, 0-1, 1-2, 2-5, 5-10, 10-20, 20-35, 35-50, 50-70, 70-80, 80-90, and/or 90-100% of the difference between the first threshold temperature and the maximum temperature; etc.), and/or by any other suitable amount.

Figure 3A:
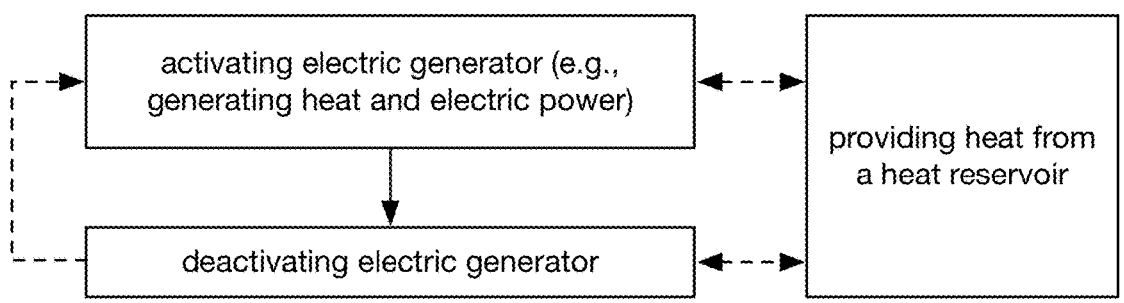
FIG. 3A is a schematic representation of an embodiment of a method for combined heat and electric power generation.
Figure 3B:
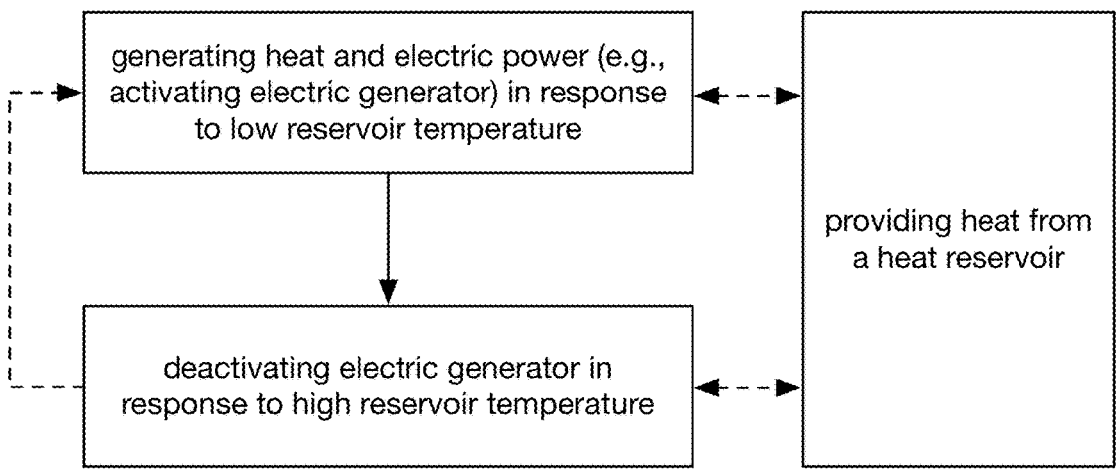
FIG. 3B is a schematic representation of an example of the embodiment depicted in FIG. 3A.

In this example, once the reservoir temperature drops back below the first threshold (e.g., due to heat output such as hot water use, due to heat losses, etc.), the electric generator is preferably reactivated such as described above (e.g., and then deactivated upon reaching the second threshold, and so on, continuing the cycle, such as shown by way of example in FIGS. 3A-3B). Accordingly in this embodiment, the duty cycle of the electric generator can be maximized, given the overall constraints of the system.

Additionally or alternatively, the electric generator may be controlled based on electricity demand, such as being activated to satisfy electricity demand (e.g., provide surge power within a facility, such as residence, in which the system is installed; provide surge power to the electric power grid; etc.), and/or based on other criteria, such as responding to external signals (e.g., electricity pricing signals, electricity demand signals, system control signals, etc.). In one example, the electric generator (and/or any other suitable elements of the system) may be controlled by and/or based on external signals, such as control signals received from a utility provider, utility regulator, government entity, and/or other controlling entity. However, the electric generator can additionally or alternatively be controlled in any other suitable manner.

Additionally or alternatively, the system may include one or more backup heat rejection elements, which can function to accept heat (e.g., from the electric generator), such as if the heat reservoir cannot (e.g., has reached and/or is projected to reach a threshold temperature such as the maximum temperature). For example, the electric generator can reject heat to the heat reservoir when the heat reservoir is in condition to accept the heat (e.g., analogous to the operation mode described above), but can also run, rejecting heat to the backup heat rejection element(s) at other times (e.g., at all times, under certain circumstances such as when electricity demand is high, etc.).

The heat reservoir can include a temperature control element (e.g., at the outlet), which can function to enable a more consistent heat output temperature (e.g., hot water temperature). For example, the temperature control element can mix heated water output from the reservoir with unheated water, thereby achieving a desired output temperature. In a specific example, the temperature control element includes a thermostatic valve that controls the mixing of the heated and unheated water such that a substantially constant output temperature is maintained.

In some embodiments, the heat reservoir can additionally or alternatively include heat storage materials other than water. For example, the heat reservoir can include one or more phase change materials (PCMs) (e.g., waxes, fatty acids, salt hydrates, etc.) configured to store and release heat (e.g., wherein heat is stored by melting the PCM, and can be released by solidification of the PCM). In examples, the additional storage material(s) (e.g., the PCM) can release heat to the heated water reservoir, and/or can release heat to directly satisfy external heat demands (e.g., to heat water to be delivered to a user as hot water, to provide space heating such as via radiative and/or forced air heating, etc.).

In a first embodiment, the additional storage material (e.g., the PCM) is thermally coupled (e.g., in direct contact with, arranged near such as separated by a thermally conductive element, coupled by a heat exchanger, etc.) to the hot water reservoir. For example, the additional storage material can be at substantially the same temperature as the water in the reservoir, and can function to increase the heat capacity of the heat reservoir. In examples, the heat received by the heat reservoir can be received primarily by the water (e.g., which can then heat the additional storage material), primarily by the additional storage material (e.g., which can then heat the water), or substantially received by both (e.g., received concurrently by both; received controllably by one or the other, such as received by the water reservoir or by both when the water is sufficiently below a threshold temperature such as the maximum temperature, and received only by the additional storage material otherwise; etc.).

In a second embodiment, the additional storage material (e.g., the PCM) may receive heat from the other elements of the system, and may reach (e.g., occasionally reach, be maintained at, etc.) substantially higher temperatures than the water (e.g., reaching temperatures higher than a maximum water temperature in the system, higher than a water boiling temperature such as 100° C., etc.), wherein the additional storage material can then provide heat to the water, such as by being thermally coupled to the water reservoir, by being operable to be thermally coupled to the water reservoir (e.g., by a controllable heat exchanger, which can be controlled to transfer heat to the water reservoir, such as only when heat is demanded and/or only when the water is below a threshold temperature, etc.). In a variation of this embodiment, the heat reservoir does not include a heated water reservoir. For example, the heat reservoir can be thermally coupled to a water supply line and can be configured to heat water as it flows through the supply line (e.g., heat water when flow is detected, such as flow above a threshold flow rate, and stop heating water when little or no flow is detected), such as in a manner analogous to an on-demand water heater. However, the additional storage material(s) can additionally or alternatively be included in the heat reservoir in any other suitable manner.

In some variations, the heat reservoir can include a backup heat source (e.g., burner, electrically resistive element, heat pump, etc.), which can function to directly heat the reservoir (e.g., not intermediated by the electric generator). In such variations, the backup heat source can be activated in response to demand for heating that exceeds the heat output of the electric generator (e.g., the electric generator is active and is rejecting heat into the heat reservoir, but the heat provided by the electric generator is insufficient to maintain an acceptable temperature within the heat reservoir and/or to provide heating at an acceptable temperature). For example, if the heat reservoir goes below (or is projected to go below, such as based on the present heat fluxes, based on projected heat demand, etc.) a third threshold temperature (e.g., minimum temperature, temperature within a threshold range of the minimum temperature, such as less than 1, 2, 5, 10, or 20° C. above or below the minimum temperature, etc.), the backup heat source can be activated (e.g., while keeping the electric generator on, activated instead of the electric generator, etc.). In this example, the backup heat source can remain on until the heat reservoir is sufficiently above the minimum temperature and/or the third threshold temperature (e.g., more than 1, 2, 5, 10, or 20° C. above the minimum temperature and/or the third threshold temperature), until the heating demand ceases or lessens (e.g., lessens to such an extent that the electric generator alone can provide sufficient heating for the heat reservoir), until determining that the electric generator alone is projected to be able to provide sufficient heating, and/or until any other suitable criteria are satisfied.

However, the heat reservoir 130 can additionally or alternatively include any other suitable elements in any suitable arrangement.

2.2 Electric Generator.

As described above, the electric generator 101 preferably includes a heat source 110 and an energy converter 120. The heat source 110 preferably functions to provide a heat input to the energy converter 120 (and/or to the heat reservoir 130).

The heat source is preferably a burner, more preferably a recuperating burner. However, the heat source can alternatively include any other suitable chemical energy input, radiothermal input, and/or any other heat input and/or other element operable to heat the energy converter. The heat source (e.g., burner) preferably delivers heat (e.g., heat of combustion) to the energy converter. The heat can be delivered radiatively, convectively, conductively, and/or in any other suitable manner. For example, the heat source can produce a flame near and/or incident upon the energy converter.

The burner preferably includes an exhaust (e.g., condensing exhaust) configured to deliver additional heat to the energy converter and/or heat reservoir. For example, heat can be delivered at high temperature from both the burner and the exhaust to the energy converter, and additional heat can be delivered at lower temperature (e.g., from a condensing portion of the condensing exhaust) to the heat reservoir.

However, the heat source 110 can additionally or alternatively include any other suitable elements.

The heat source is preferably operable between two or more modes, which can include an active mode, in which the heat source consumes significant fuel (e.g., consumes fuel at more than a threshold rate, at substantially its maximum consumption rate, etc.) and/or generates significant heat, and an inactive mode, in which the heat source consumes substantially less fuel than in the active mode (e.g., consumes fuel at substantially less than the threshold rate, less than 1, 2, 5, 10, 20, or 50% of the threshold rate, etc.; consumes no or substantially no fuel, such as only consuming fuel to maintain a pilot light; etc.) and/or generates substantially less heat than in the active mode (e.g., generates substantially no heat, generates heat at less than a threshold amount of the rate at which it generates heat in the active mode, such as less than 1, 2, 5, 10, 20, or 50% of the rate, etc.). The heat source is preferably operated in the active mode when the energy converter is activated (e.g., wherein operating the heat source in the active mode causes activation of the energy converter), and is preferably operated in the inactive mode when the energy converter is not activated (e.g., wherein operating the heat source in the inactive mode causes deactivation of the energy converter), but can additionally or alternatively be operated in any other suitable manner, and/or can additionally or alternatively be operable in any other suitable modes.

The energy converter 120 preferably functions to convert a heat input (e.g., received from the heat source) into an electrical power output (e.g., provided to an external load 14) and to reject waste heat to the heat reservoir. The energy converter is preferably a solid state device, such as a thermionic energy converter (TEC), thermoelectric device, thermophotovoltaic device, and/or any other suitable solid state energy converter. In some variations, the energy converter can additionally or alternatively accept one or more chemical fuel inputs (e.g., to be converted into the electrical power output); for example, the energy converter can be (or include) one or more fuel cells. In some such variations (e.g., in which the converter accepts chemical fuel input and not heat input), the energy converter may not include a hot region and cold region as described below; rather, it may reject heat (e.g., heat resulting from and/or otherwise associated with conversion of chemical fuel potential energy into electric energy) into one or more heat rejection regions, which a person of skill in the art will recognize are preferably arranged in the system and/or are preferably used in a manner analogous to the cold region (e.g., wherein the heat rejection region is thermally coupled to the heat reservoir and provides heat to the heat reservoir). However, the system can additionally or alternatively include any other suitable type of energy converter.

Figure 2A:
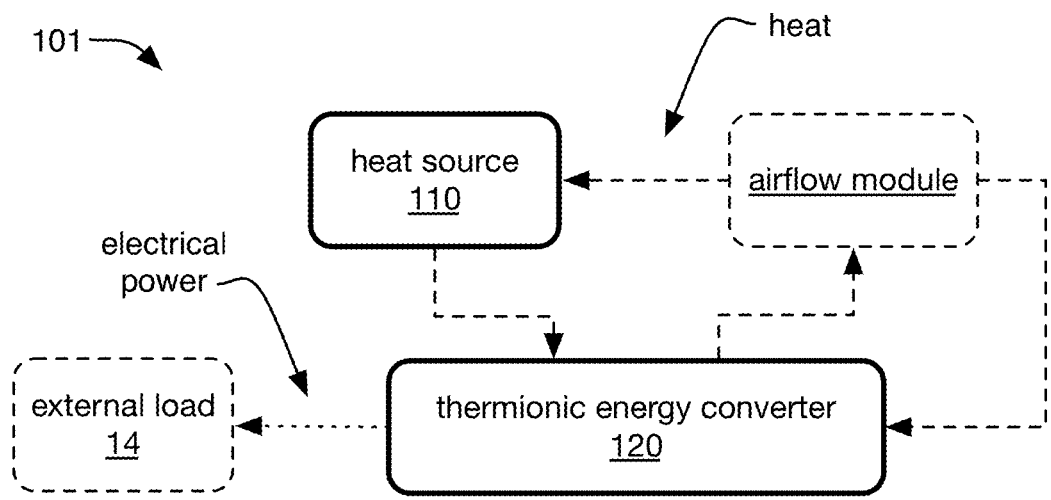
FIG. 2A is a schematic representation of an embodiment of an electric generator of the system.

The converter is preferably non-mechanical (e.g., having no or substantially no moving parts, having moving parts only in auxiliary elements such as heat rejection elements, etc.), but can alternatively be any other suitable converter. In some embodiments in which the converter includes a TEC, the TEC can include one or more elements such as described in U.S. patent application Ser. No. 16/715,705, filed 16 Dec. 2019 and titled "System and Method for Work Function Reduction and Thermionic Energy Conversion", U.S. patent application Ser. No. 16/883,762, filed 26 May 2020 and titled "System and Method for Thermionic Energy Conversion", and/or U.S. patent application Ser. No. 17/155,638, filed 22 Jan. 2021 and titled "Small Gap Device System and Method of Fabrication", each of which is herein incorporated in its entirety by this reference (e.g., as shown in FIGS. 2A-2B).

In a first embodiment (e.g., designed for residential applications, such as single-family or small multi-unit dwellings), the energy converter can have a power scale (e.g., input power accepted or output electrical power generated) less than 1000 watts, preferably less than 500 watts (e.g., 10-50, 50-100, 100-200, 150-250, 250-350, and/or 350-500 W, etc.). In examples of this embodiment, the energy converter can include an active area on the order of single square inches (e.g., 1-10 square inches, such as 1-2, 2-5, or 5-10 square inches). In a second embodiment (e.g., designed for commercial, industrial, and/or large multi-unit residential applications), the energy converter may have a power scale greater than 1 kW (but alternatively less than 1 kW) and/or an active area greater than 10 square inches (but alternatively less than 10 square inches), preferably sized approximately proportional to the heating demand of the application (e.g., with similar proportionality as in the first embodiment described above). However, the converter can alternatively have any other suitable scale.

Figure 2B:
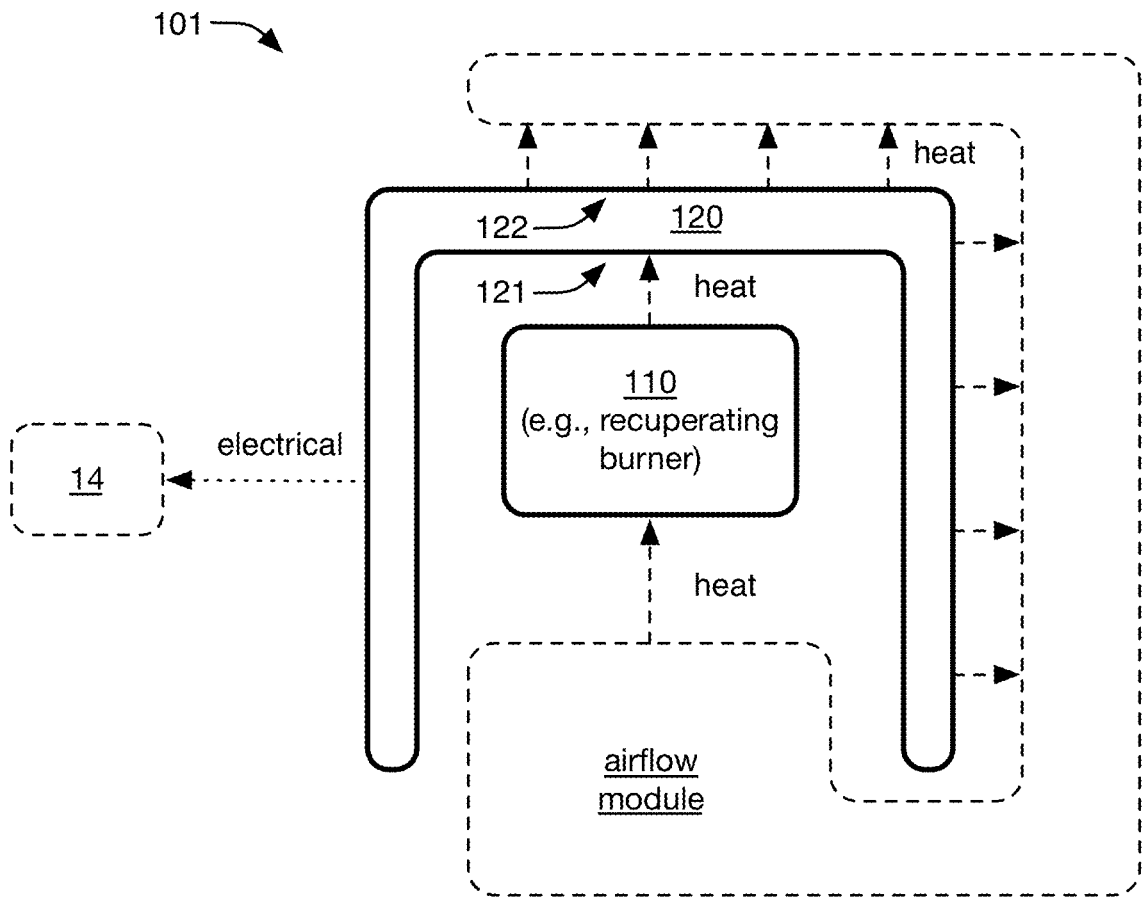
FIG. 2B is a schematic representation of an example of the embodiment depicted in FIG. 2A.

The energy converter 120 preferably defines a heat input region 121 (e.g., hot region) configured to accept a heat input from the heat source, and a heat rejection region 122 (e.g., cold region) configured to reject waste heat to the heat reservoir (e.g., as shown in FIG. 2B). For a TEC, the hot region is preferably the emitter (and/or a thermal coupling region that transfers heat to the emitter) and the cold region is preferably the collector (and/or a thermal coupling region that transfers heat from the collector). In some examples, these regions are substantially parallel planar regions (e.g., opposing each other across a thickness of the converter). In some examples, in which the TEC includes one or more elements such as described in U.S. patent application Ser. No. 16/883,762, filed 26 May 2020 and titled "System and Method for Thermionic Energy Conversion", which is herein incorporated in its entirety by this reference (e.g., the TEC defines a cavity in which it receives heat), the hot region 121 can include one or more elements such as described in U.S. patent application Ser. No. 16/883,762 regarding the 'emitter module 100' (e.g., the 'inner shell 120'), and/or the cold region 122 can include one or more elements such as described in U.S. patent application Ser. No. 16/883,762 regarding the 'collector module 200' (e.g., the 'electron collector 210' and/or the 'cooling element 230'), such as wherein the 'collector module 200' rejects heat to the heat reservoir (e.g., in addition to or instead of rejecting heat to the 'airflow module 13'). However, these regions can alternatively have any other suitable shape and/or arrangement.

The energy converter can output the generated electrical power to one or more electrical elements, such as electrical systems (e.g., building-scale electrical system, utility-scale electric grid, etc.), electrical storage modules 140, and/or any other suitable elements. Additionally or alternatively, a subset of (or all of) the generated electrical power can be used to power the system 100 (e.g., enabling system operation to continue during an electric grid outage). However, the generated electrical energy can additionally or alternatively be used in any other suitable manner.

The cold region 122 is preferably thermally coupled to the heat reservoir. This coupling is preferably a direct coupling (e.g., thermally conductive coupling, preferably via low thermal resistance elements). However, the thermal coupling can additionally or alternatively be intermediated by elements such as heat exchangers, coupling fluids (e.g., a forced air coupling), and/or any other suitable thermal couplings. In some examples, the thermal coupling may be configured to present a high thermal resistance between the cold region and the heat reservoir (e.g., to prevent localized boiling of the fluid in the heat reservoir, to aid more even heating of the heat reservoir, etc.). In some examples, the heat source exhaust can also reject heat to the reservoir. For example, the heat source exhaust can provide high-temperature heat output to the hot region 121, and provide and lower-temperature heat output (e.g., from a later heat exchange stage, such as a condensing stage) to the reservoir

130. However, the electric generator can additionally or alternatively deliver heat to the heat reservoir in any other suitable manner.

In some examples, the energy converter is a TEC that includes a cesium reservoir. In some such examples, the cesium reservoir is preferably maintained within a particular temperature range, such as a range between 140 and 400° C. (e.g., 140-180, 180-230, 200-250, 220-280, 230-270, 250-300, 260-320, and/or 320-400° C.). In such examples, the cesium reservoir can optionally be thermally coupled to the heat reservoir, wherein the heat reservoir can act as a thermal ballast which assists in maintaining the cesium reservoir within the desired temperature range (e.g., preventing the cesium reservoir from overheating). However, the cesium reservoir can additionally or alternatively be configured in any other suitable manner.

The energy converter 120 can additionally or alternatively include any other suitable elements in any suitable arrangement.

In some examples, the electric generator 101 can include one or more elements such as described in U.S. patent application Ser. No. 16/883,762, filed 26 May 2020 and titled "System and Method for Thermionic Energy Conversion", which is herein incorporated in its entirety by this reference (e.g., the electric generator 101 can include the system of U.S. patent application Ser. No. 16/883,762, wherein the heat source 110 is such as described regarding the power input 12 of U.S. patent application Ser. No. 16/883,762, the energy converter 120 is such as described regarding the TEC 11 of U.S. patent application Ser. No. 16/883,762, and/or the electric generator 101 optionally includes one or more airflow modules 13 and/or other elements as described in U.S. patent application Ser. No. 16/883,762). In a specific example, the electric generator 101 includes a burner (e.g., recuperating burner) arranged within a heating cavity defined by a TEC, such as described in U.S. patent application Ser. No. 16/883,762 (e.g., as shown in FIG. 2B).

However, the electric generator 101 can additionally or alternatively include any other suitable elements in any suitable arrangement.

2.3 Electric Storage Module.

The system can optionally include one or more electric storage modules 140. The electric storage module can function to store energy received from the electric generator (e.g., for later use, such as for on-demand electric power). The electrical storage module 140 can include one or more batteries (preferably secondary batteries), capacitors (e.g., supercapacitors), and/or any other suitable electrical storage elements. In some embodiments, the electric storage module can deliver electric power to satisfy demand (e.g., provide surge power within a facility, such as residence, in which the system is installed; provide power within a facility in which it is installed if the electric power grid is not currently delivering power; provide power to other elements of the system 100, such as providing power to start and/or operate the electric generator 101; provide surge power to the electric power grid; etc.) and/or respond to external signals (e.g., electricity pricing signals, system control signals, etc.). Additionally or alternatively, However, the electrical storage module can additionally or alternatively include any other suitable elements in any suitable arrangement, and/or can have any other suitable functionality.

2.4 Arrangements.

Figure 1C:
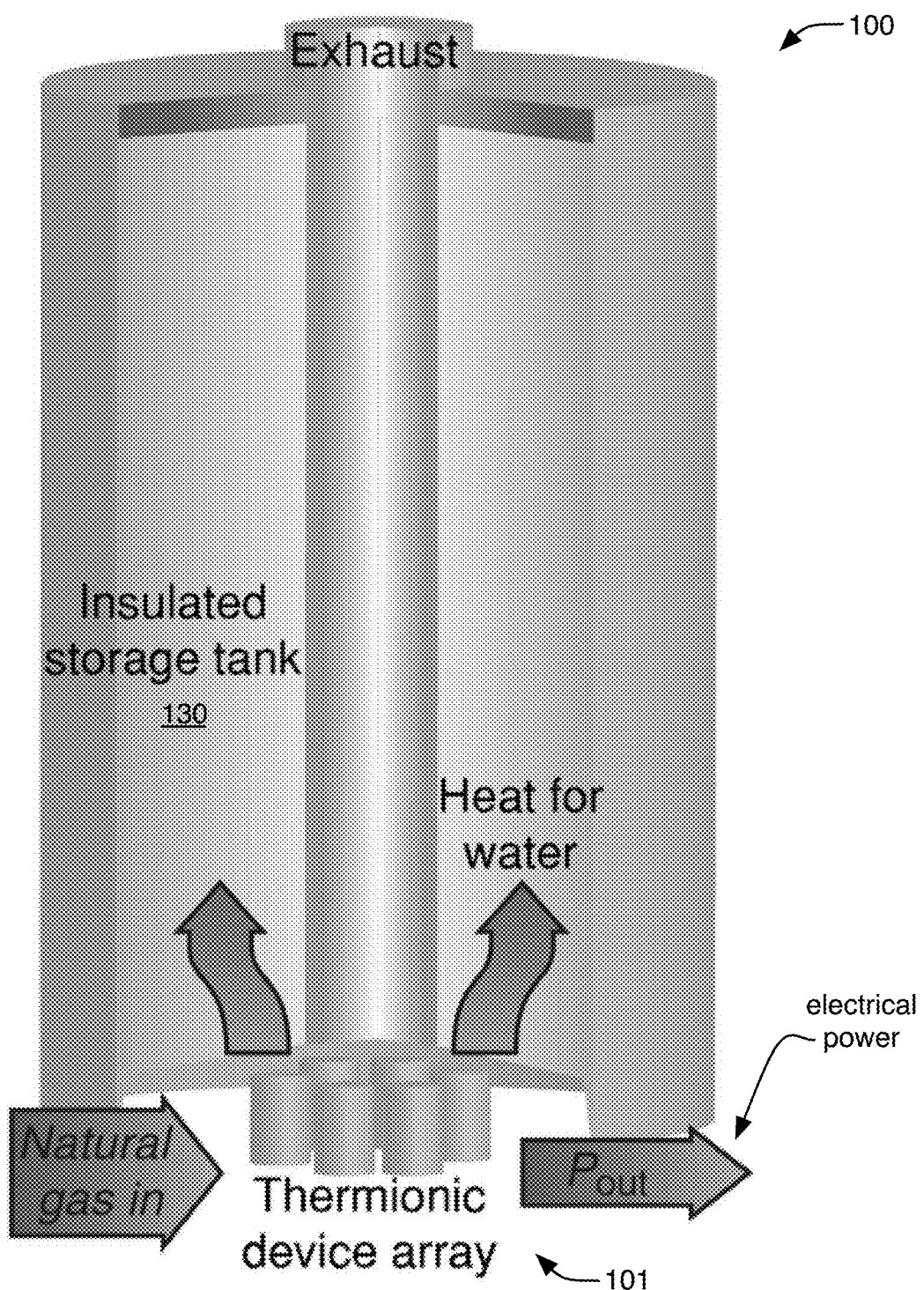
FIG. 1C is a schematic representation of a specific example of the example depicted in FIG. 1B.

The system preferably includes one or more electric generators 101 thermally coupled to the heat reservoir 130. In some such examples, in which the heat reservoir includes a hot water tank, the electric generators can be arranged near the bottom of the hot water tank, such as at or near the base of an upright cylindrical tank (e.g., as shown in FIG. 1C).

The electric generators are preferably arranged spaced out from each other along one or more boundaries (e.g., faces) of the heat reservoir. For example, the electric generators can define a substantially planar array at the reservoir base. In one example, the system includes 4-12 (e.g., six) electric generators arranged in a ring (preferably with substantially equiangular spacing, such as about a central axis of the heat reservoir). In variations, the system can include multiple rings (e.g., concentric rings), each ring including the same or differing numbers of electric generators (e.g., inner rings with fewer electric generators and outer rings with greater numbers of electric generators, such as to establish substantially equidistant spacing between electric generators of all rings), and/or can include a single central electric generators at the center of a ring defined by some or all other electric generators. However, the electric generators can alternatively have any other suitable arrangement.

The heat reservoir 130 can include one or more thermally conductive elements, which may facilitate thermal coupling of the electric generators to the heat reservoir. These thermally conductive elements can function to distribute heat received from the electric generators over a larger portion of the reservoir (e.g., facilitate more even heating of the heat reservoir). For example, a heat reservoir with a hot water tank can include a high-conductivity interface between the tank base and the electric generators. Such an interface can function to deliver heat to the water more evenly across the entire base, rather than the more localized heating that could result from direct heat transfer from the electric generators to the water. The heat reservoir can optionally include one or more elements to promote more even heat distribution within the reservoir, such as convection elements configured to enable and/or promote mixing of water in a hot water tank. By promoting convection within the heat reservoir, these elements can help prevent localized over-heating (e.g., boiling) within the reservoir.

In some examples, each electric generator 101 has a separate exhaust system. The electric generator exhaust preferably provides additional heat to the hot region 121 of the generator (e.g., as described in U.S. patent application Ser. No. 16/883,762, filed 26 May 2020 and titled "System and Method for Thermionic Energy Conversion", which is herein incorporated in its entirety by this reference), but alternatively may not provide additional heat to the hot region (or may only provide such heat indirectly). In some such examples, these multiple exhausts can be combined and/or brought close to each other wherein this combined exhaust can provide further heat rejection to the heat reservoir (e.g., wherein the combined exhaust runs through the reservoir, such as along a central axis of the reservoir).

However, the system can additionally or alternatively include any other suitable elements in any suitable arrangement.

3. Method.

As described above, the method 200 for combined heat and electric power generation is preferably performed using the system 100, but can additionally or alternatively be performed using any other suitable system. In some embodiments, the method 200 can include: activating an electric generator, deactivating the electric generator, and/or providing heat from a heat reservoir (e.g., as shown in FIG. 3A).

The electric generator is preferably activated such as described above regarding the system (e.g., based on one or more criteria, such as criteria associated with heat reservoir temperature and/or heat demand, etc.). When the electric generator is activated, the heat input preferably operates in the active mode, generating heat and providing some or all of the generated heat to the energy converter (e.g., TEC). In response to receiving this heat, the energy converter preferably generates an electric power output (which can be provided to an electric system, such as described above regarding the system), thereby generating waste heat (e.g., at a lower temperature than the heat it receives), which it preferably provides to the heat reservoir (e.g., thereby increasing the temperature of an energy storage material in the heat reservoir, such as a fluid stored within and/or flowing through the heat reservoir).

The electric generator is preferably deactivated such as described above regarding the system (e.g., based on one or more criteria, such as criteria associated with heat reservoir temperature and/or heat demand, etc.). When the electric generator is deactivated, the heat input preferably operates in the inactive mode (e.g., not providing significant heat to the energy converter). Accordingly, while the electric generator is deactivated, the energy converter will typically not generate significant electric power output and will typically not provide significant heat output to the heat reservoir.

Providing heat from the heat reservoir is preferably performed such as described above regarding the system (e.g, regarding the heat reservoir). In embodiments in which the heat reservoir includes a fluid heat storage material, the fluid can be heated (e.g., by heat received from the electric generator, by heat generated by a backup heat source, by heat received from other elements of the heat reservoir such as from other heat storage materials, etc.) while retained within the reservoir, while passing through the reservoir, and/or while outside the reservoir (e.g., while flowing past a heat exchanger of the reservoir). The heated fluid is preferably delivered to one or more heated fluid demanders (e.g., provided upon and/or in response to demand for the heated fluid). For example, opening of a hot water valve (e.g., faucet) can cause water to flow (e.g., from the heat reservoir outlet) through the valve (e.g., out the faucet). In this example, additional water can flow into the reservoir via the inlet (and this additional water can then be heated, preferably in the same manner as described above). In an alternate variation, the fluid may flow in a loop (e.g., when a flow controlling valve is open, at all times, etc.), such as wherein the heated fluid exits the reservoir via the outlet, flows to a heat demander to which it transfers some of its heat (e.g., by flowing through a heat exchanger), and then flows back into the reservoir via the inlet. In examples, the heat demanders (e.g., heated fluid demanders) can include hot water outlets, space heating systems, other heat users such as described above regarding the system, and/or any other suitable elements.

The electric generator is preferably activated and deactivated such that it has a duty cycle (e.g., time activated divided by total time) greater than a threshold amount (e.g., 40%, 50%, 60%, 70%, 80%, 90%, 95%, 98%, 40-50%, 50-60%, 60-75%, 75-85%, 85-95%, and/or 95-100%, etc.), preferably greater than 50%, but alternatively any other suitable duty cycle (e.g., as described above regarding the system). In some examples, activation and/or deactivation is performed based on threshold temperatures and/or heat fluxes, wherein the thresholds can be predetermined, dynamically determined, constant, vary based on factors such as time of day, historical usage, and/or anticipated usage, and/or can be determined in any other suitable manner.

However, activating the electric generator, deactivating the electric generator, and/or providing heat from the heat reservoir can additionally or alternatively be performed in any other suitable manner. Further, the method 200 can additionally or alternatively include any other suitable elements performed in any suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method for combined heat and electric power generation, comprising:
   at a heat reservoir, while a heat reservoir temperature of the heat reservoir is greater than a minimum temperature, heating a fluid;
   providing the heated fluid to an external heat demand element;
   while the heat reservoir temperature is less than a threshold temperature, activating an electric generator thermally coupled to the heat reservoir, wherein, while the electric generator is activated:
   a heat source of the electric generator generates heat and provides the heat to a solid-state energy converter of the electric generator;
   the solid-state energy converter generates an electric power output; and the solid-state energy converter rejects waste heat to the heat reservoir;

after activating the electric generator, while the heat reservoir temperature is greater than the threshold temperature, deactivating the electric generator.

2. The method of claim 1, wherein the heated fluid is water.

3. The method of claim 2, wherein the external heat demand element comprises a domestic hot water faucet fluidly coupled to the heat reservoir by a hot water pipe, wherein providing the heated fluid to the external heat demand element is performed automatically in response to opening of the domestic hot water faucet.

4. The method of claim 2, wherein the threshold temperature is less than 100° C.

5. The method of claim 1, further comprising determining that the heat reservoir temperature is less than the threshold temperature, wherein activating the electric generator is performed in response to determining that the heat reservoir temperature is less than the threshold temperature.

6. The method of claim 5, further comprising, while the electric generator is active, determining that the heat reservoir temperature is greater than a second threshold temperature greater than the threshold temperature, wherein deactivating the electric generator is performed in response to determining that the heat reservoir temperature is greater than the second threshold temperature.

7. The method of claim 1, wherein a duty cycle of the electric generator, defined as a ratio between time in which the electric generator is active to total time, is greater than 30%.

8. The method of claim 7, wherein the duty cycle is greater than 60%.

9. The method of claim 1, wherein the heat source comprises a burner that, while the electric generator is activated, generates the heat by combusting fuel.

10. The method of claim 9, wherein, while combusting fuel, the burner generates an exhaust, wherein the exhaust transfers heat to the heat reservoir.

11. The method of claim 1, wherein the solid-state energy converter comprises a thermionic energy converter.

12. A system for combined heat and electric power generation, comprising:
a heat generator operable between:
an active mode, in which the heat generator consumes fuel at greater than a threshold rate and generates heat; and
an inactive mode, in which the heat generator consumes fuel at substantially less than the threshold rate;
a solid-state electric generator comprising a heat input region and a heat rejection region, the heat input region thermally coupled to the heat generator; and
a heated water reservoir thermally coupled to the heat rejection region of the solid-state electric generator, the heated water reservoir defining a cavity configured to store heated water, the cavity defining a water input and a heated water output;

wherein the solid-state electric generator is configured to:
accept heat from the heat generator at the heat input region;
generate an electric power output; and
provide waste heat to the heated water reservoir at the heat rejection region.

13. The system of claim 12, further comprising a thermostatic mixing valve configured to receive heated water at a varying heated water temperature from the heated water output, receive water at a temperature lower than the varying heated water temperature, and mix the water and heated water to produce intermediate-temperature water of a substantially fixed temperature.

14. The system of claim 12, wherein the solid-state electric generator comprises a thermionic energy converter (TEC).

15. The system of claim 14, wherein:
the TEC defines a cavity, wherein the heat input region bounds the cavity and the heat rejection region opposes the cavity across the heat input region; and
the heat generator comprises a burner arranged within the cavity, wherein, in the active mode, the burner generates the heat by combusting the fuel.

16. The system of claim 15, wherein:
the solid-state electric generator further comprises a second TEC defining a second cavity;
the heat generator further comprises a second burner arranged within the second cavity; and
the system further comprises an exhaust manifold, the exhaust manifold comprising:
a merged exhaust tube extending through and thermally coupled to the heated water reservoir;
a first exhaust tube extending from the burner to the merged exhaust tube; and
a second exhaust tube extending from the second burner to the merged exhaust tube.

17. The system of claim 12, wherein the heat generator comprises a burner arranged within the cavity, wherein, in the active mode, the burner generates the heat by combusting the fuel.

18. The system of claim 17, wherein the burner is a recuperating burner.

19. The system of claim 17, wherein:
the burner comprises an exhaust manifold extending from the burner through the cavity of the heated water reservoir; and
while combusting the fuel, the burner generates an exhaust, wherein the exhaust transfers heat to the heated water reservoir via the exhaust manifold.

20. The system of claim 19, wherein:
the solid-state electric generator comprises a plurality of generator modules;
the heat generator comprises a set of burners, the set of burners comprising the burner, wherein each burner of the set is associated with a respective generator module of the plurality; and
each burner of the set comprises a respective exhaust tube of the exhaust manifold.

* * * * *